United States Patent [19]

Grinberg et al.

[11] Patent Number: 4,871,232
[45] Date of Patent: Oct. 3, 1989

[54] METHOD AND APPARATUS FOR ULTRA HIGH FREQUENCY SPECTRUM ANALYSIS

[75] Inventors: Jan Grinberg; Emanuel Marom, both of Los Angeles; Bernard H. Soffer, Pacific Palisades; Thomas R. O'Meara, Malibu; Adrian E. Popa, Newbury Park, all of Calif.

[73] Assignee: Hughes Aircraft Company, Los Angeles, Calif.

[21] Appl. No.: 130,032

[22] Filed: Dec. 7, 1987

[51] Int. Cl.$^4$ .............................................. G01R 23/17
[52] U.S. Cl. ............................... 350/162.11; 350/169; 364/827
[58] Field of Search ........................... 350/162.11, 169; 364/827

[56] References Cited

U.S. PATENT DOCUMENTS 4,093,357  6/1978  Jacobson et al. ................... 350/338
4,464,624  8/1984  Osterwalder ........................ 324/77

OTHER PUBLICATIONS

S. K. Yao and C. S. Tsai, "Acousto-Optic Bragg Diffraction", Applied Optics, vol. 16 (1977), pp. 3032–3043.

Born and Wolf, "The Lummer-Gehrcke Interferometer", Principles of Optics, 5th Edith, 1975, Pergamon Press, pp. 341–347.

Primary Examiner—Bruce Y. Arnold
Attorney, Agent, or Firm—V. D. Duraiswamy; W. K. Denson-Low

[57] ABSTRACT

A high frequency spectral analysis system and method operates by modulating an optical beam with a high frequency signal to be analyzed, and sampling the beam simultaneously at periodically spaced locations along its length. The sampled portions are then focused to a spectral mapping. In the preferred embodiment a beam is directed in a zigzag pattern through a plate, one surface of which is totally reflective and the opposite surface of which is partially reflective. Periodic parallel samples are obtained from the minor portions of the beam which are transmitted out of the plate through the partially reflective surface. The totally reflective surface is preferably formed as a series of cylindrical surfaces which focus the beam to small spots at the partially reflective surface, thereby permitting a higher spatial density of samples without overlapping. The plate thickness is selected so that the beam is sampled at the Nyquist rate for the highest frequency contained in the signal of interest.

30 Claims, 3 Drawing Sheets

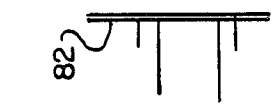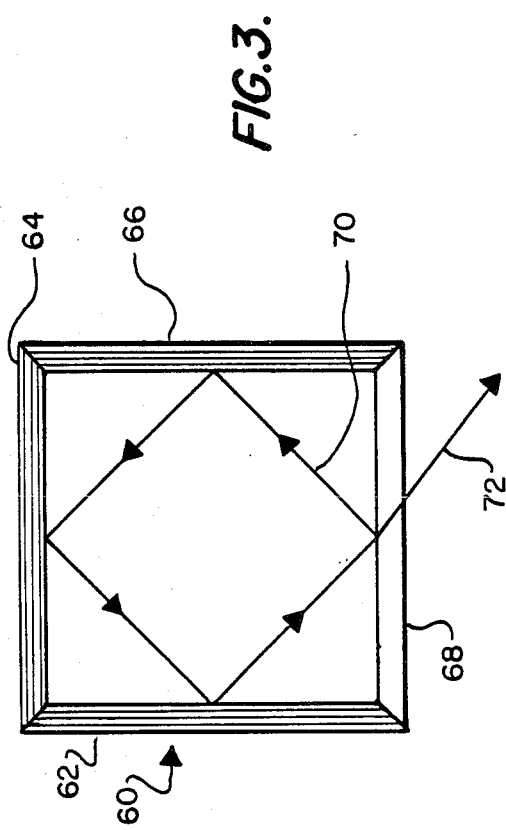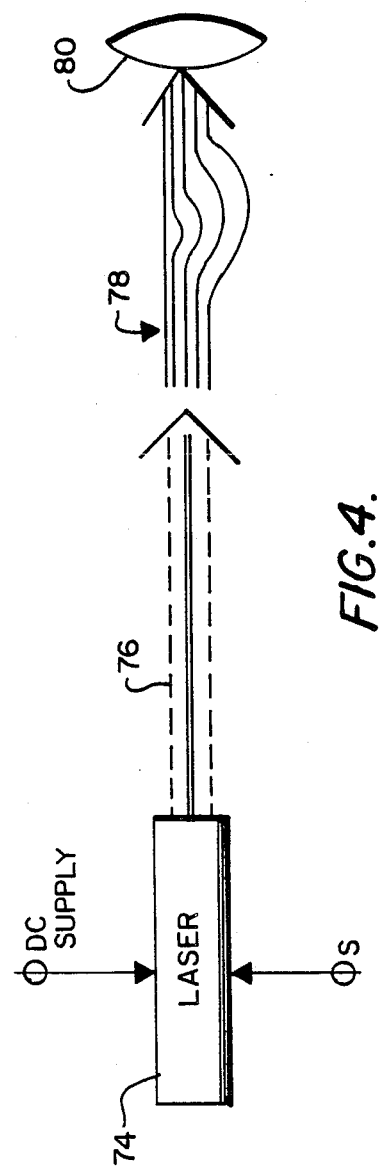

METHOD AND APPARATUS FOR ULTRA HIGH FREQUENCY SPECTRUM ANALYSIS

BACKGROUND OF THE INVENTION

1. Field of the Invention

This invention relates to the spectral analysis of rf signals, and more particularly to the analysis of signals having high frequencies considerably above 1 GHz.

2. Description of the Related Art

To obtain the spectral composition of a signal, it is necessary to sample the signal so that the highest frequency components are sampled at least twice each cycle (the Nyquist criterion). The higher the upper frequency one tries to detect, the shorter must be the time interval between samples. Unfortunately, electronic circuits are not presently capable of following very fast sampling rates. Other approaches have accordingly been tried to obtain the same result, such as the use of a sweeping electronic signal heterodyning with the unknown signal, and the use of acoustic-optic interactions. Acousto-optic modulators in particular are attractive because of their simplicity, fast real time operation, good resolution, large integration time and sensitivity. Such systems ar described, for example, in S. K. Yao and C. S. Tsai, "Acousto-optic Bragg Diffraction," Applied Optics, Vol. 16, (1977), p. 3032. Unfortunately, these systems are not capable of handling signal frequencies above several GHz.

U.S. Pat. No. 4,464,624 to Osterwalder describes a broad band optical spectrum analyzer in which a laser beam is reflected off a diffraction grating which reflects the beams due to different signal frequencies at different angles. The reflective rays are focused by a transforming lens so that rays with the same angular orientation are directed onto the same point. The intensities of the individual reflected spots are then taken as an indication of the frequency content of the original signal. This patent also discusses the general acoustic modulator system referred to above, in which the acousto-optical modulator is implemented as a Bragg cell. While claiming an operational range beyond 10 GHz, in actual practice the patented system exhibits a very small diffraction angle between different frequencies. This results in the need for a large apparatus, in the order of several meters long, to obtain a satisfactory resolution.

Another spectrum analyzer, referred to as the Lummer-Gehrcke interferometer, is described in a text by Born and Wolf, "Principles of Optics", 5th ed. (1975), Pergamon Press, pages 341-347. In this device a beam of light is admitted into a long, plane parallel plate of glass or crystalline quartz from a source on the long axis of the plate, through a prism fixed to one end of the plate. The beam meets the plate surfaces at an angle slightly smaller than the critical angle. A series of beams leaves each side of the plate near grazing emergence, and these are collected by a lens to form an interference pattern in the lens focal plane. The lens must be large enough to extend from one side of the plate to the other and collect the beams on each side.

SUMMARY OF THE INVENTION

In view of the above problems, the purpose of the present invention is to provide a method and apparatus for high frequency spectrum analysis which retains the benefits of the acousto-optical modulator approach, but is also operational at much higher frequencies in the range of 10-20 GHz or more, with high resolution, large capture rates and a relatively compact size.

The invention operates by modulating an optical beam, preferably a laser beam, with a high frequency signal to be analyzed. Periodically spaced portions of the modulated beam are sampled simultaneously, and the sampled portions are analyzed to determine the frequency content of the original signal. Sampling is preferably accomplished by directing the beam through an optical guide plate, with the beam internally reflected off the opposite surfaces of the plate as it proceeds in a zigzag fashion. One of the plate surfaces is only partially reflective, and permits small parallel sample portions of the beam to be transmitted out of the plate at each location where it is struck by the beam. The beam angle is selected such that the spacing along the zigzag beam path between successive samples is no more than half the period of the highest desired frequency to be measured, thereby satisfying the Nyquist criterion for that frequency. The beam samples transmitted through the plate surface are then focused, thus providing a Fourier mapping of the desired signal.

To reduce the spacing along the plate between the sample points, and yet preserve both the beam path distance between sample points and the lack of spatial overlap between successive samples, the plate surface opposite the partially reflective surface is formed with a series of internally concave reflective surfaces whose curvature images points on the partially reflective surface back to that surface. The modulated beam is focused onto the internal partially reflective surface, and thereafter is reflected down the guide channel and back and forth between the two surfaces. Each time the beam reflects off one of the concave reflective surfaces it is focused down to a small spot on the partially reflective surface, from whence a partial sample is transmitted. The portion of the beam reflected back from the partially reflective surface expands outward until it reaches the next concave reflective surface. In this manner the sample points can be located closer together, because of the smaller spot sizes on the partially reflective surface. In either embodiment the channel surface opposite the partially reflective surface can be either totally or partially internally reflective, although a totally reflective, surface is preferred for beam power conservation. To restore the plane-wave front of the sampled-beam, another array of lenticular lenses is used with a spacing identical to that contained in the plate used to generate the sampled signal, before the beam hits the Fourier transform lens.

The system is capable of achieving a high resolution Fourier mapping over a reasonable distance for frequencies in the range of 10-20 GHz and perhaps even more. This is much higher than the frequency range achievable with electronic analyzer circuits, and an order of magnitude greater than the frequencies achievable by prior acousto-optical modulator systems.

These and other features and advantages of the invention will be apparent to those skilled in the art from the following detailed description of preferred embodiments, taken together with the accompanying drawings, in which:

DESCRIPTION OF THE DRAWINGS

FIG. 3 is an end view of a four-walled embodiment of the optical guide; and

FIG. 4 is a simplified view of another embodiment in which a series of optical fibers of different lengths is substituted for the optical guide to obtain a simultaneous periodically spaced sampling of the modulated beam.

DETAILED DESCRIPTION OF PREFERRED EMBODIMENTS

Figure 1:
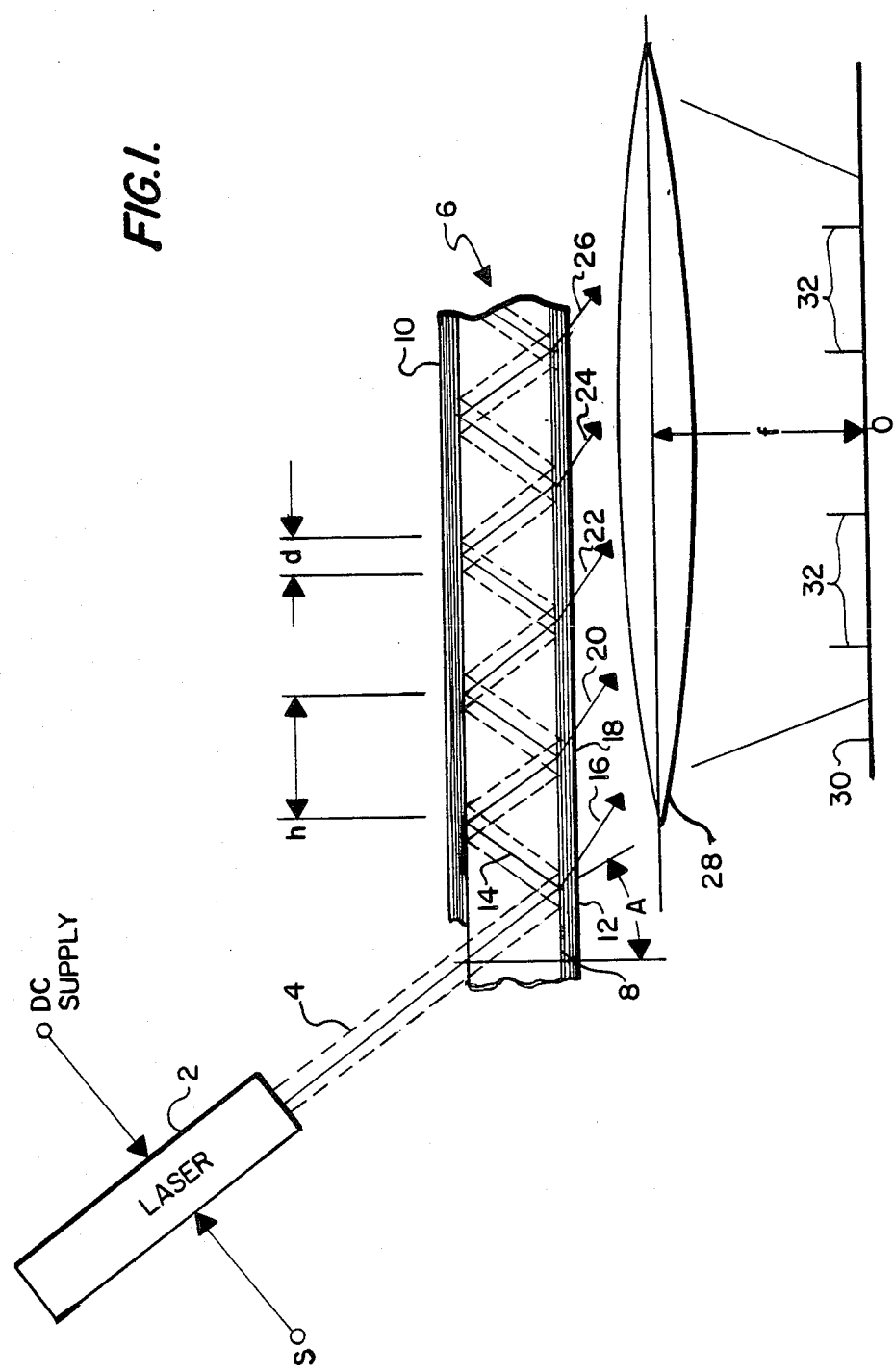
FIG. 1 is a simplified, partially sectioned view of a system incorporating the invention using an optical guide plate with opposed plane surfaces.

Referring first to FIG. 1 an embodiment of the invention is shown in which a laser 2 is operated from a DC power supply. A diode (injection) laser is preferred, since is it easy to modulate. Other beam sources might also be envisioned, but at present a laser is the only practical means to obtain the required beam collimation.

The laser is modulated with a high frequency electrical signal S, which can be in the range of about 10–20 GHz. An output optical beam 4 is generated which carries the modulation imposed by signal S. The axis of beam 4 is indicated by a solid line, while its boundaries are indicated by dashed lines. In this context the term "optical" is intended in its broad sense to include any frequency at which a laser is capable of operating, such as infrared, and not just the visible spectrum.

The beam is directed by the laser, and by intermediate optics if desired, into an optical guide structure such as glass plate 6 which has opposed parallel surfaces 8 and 10. Other structures such as an optical fiber might also be employed, but the parallel plate shown is preferred in view of its stability and uniformity. The lower surface 8 is partially internally reflective, while the upper surface 10 is at least partially, and preferably totally, internally reflective. Both the lower and upper surfaces 8 and 10 are made internally reflective, preferably by coating them with thin film dielectric layers, acting as mirrors. These consist of alternating high and low index dielectric layers, each with a thickness of one-fourth the signal wavelength to be reflected, deposited on an optional metal mirror. Dielectric mirrors are discussed in U.S. Pat. No. 4,109,357 issued June 6, 1978 to Jan Grinberg, et al. and assigned to Hughes Aircraft Company, the assignee of the present invention. The mirror for upper surface 10 is formed with 3–5 layer pairs to make it totally reflective, while the lower mirror 8 has fewer layers so that it is mostly reflective but also partially transmissive.

The beam is directed into the plate at an angle A to the normal of the plate surfaces. At the location 12 where the beam is first incident upon partially reflective surface 8, the major portion of the beam is reflected back toward upper surface 10 along path 14, while a minor portion of the beam is diffracted and transmitted out of the guide plate as a sample ray 16. The beam within the guide structure is then reflected off upper surface 10 and back down to lower surface 8 at location 18. Here another sample ray 20 is transmitted out of the plate while the major portion of the beam continues to be internally reflected. In this manner successive samples 22, 24, 66, etc. are diverted at periodically spaced locations from the main beam path as parallel sample rays.

Each sample ray should be less than 1% of the beam at that point to avoid undue beam attenuation as successive sample rays are transmitted. It is preferable that the partially reflective surface 8 be progressively modified along the length of the plate to compensate for the loss of beam power to the sample rays, and keep the sample rays equal in intensity. This can be done by slightly changing the thicknesses of the dielectric mirror layers along the length of the plate so that they are slightly out of tune with the reflected wavelength, and reflect less of the beam as one proceeds down the plate. The mirror layer thicknesses can be progressively altered by varying the angle of the plate during thin film evaporation of the coatings, by the use of a shutter to control the evaporation, or similar techniques.

The sample rays are directed onto a focusing lens 28, whose back focal plane is essentially a Fourier mapping surface 30. At any given time the successive rays represent simultaneous samples of the beam taken at regular periodic intervals along the beam path, and thus provide a time sampling as opposed to prior spatial sampling approaches. The partially reflective surface 8 functions in a manner analogous to a grating, so that the periodic sample rays are mapped by lens 28 onto a Fourier surface 30. Spikes 32 occur on opposite sides of the surface origin at distances corresponding to the beam frequencies, and with heights corresponding to the intensity of each frequency component contained in the beam.

The structure illustrated in FIG. is useful in accurately preserving the coherence of the beam and its optical path. Although the beam is shown for purposes of illustration at a substantial angle A to a normal to the plate surfaces, in practice angle A should be minimized and the beam kept as close as possible to the normal without overlapping the successive spot locations of the beam at the partially reflective surface 8. This is necessary to keep the length of plate 6 to a practical dimension. Assuming that angle A is small, the distance along the beam between lower plate 8 and upper plate 10 should not be significantly greater than the thickness of the plate. The desired plate thickness and length can then be calculated as follows:

To analyze frequencies up to 20 GHz, a 40 GHz sampling rate is necessary. Inverting the 40 GHz sampling rate yields a 25 psec time interval between successive sample points, i.e., the beam should reach each sample point approximately 25 psec after the immediately previous sample point. Multiplying this by the speed of light within the plate (glass has a refractive index of about 1.5, with a corresponding light speed of about $2 \times 10^8$ m/sec) yields a 5 mm spacing along the beam path between successive sample points. Since it is assumed that the beam path will be reasonably close to a perpendicular to the plate surfaces, and remembering that the beam must traverse the plate twice between sample locations, a plate thickness of approximately 2.5 mm results.

To determine the necessary plate length, the desired number of samples must first be known. This is an important consideration, since the resolution of the system is inversely proportional to the number of samples. For example, 100 samples will produce 1% resolution, and so forth. Assuming that 100 samples are desired for a resolution of 1%, the length of the plate will then be 100d, where d is the diameter of the beam spot along the plate, which will be approximately equal to the beam diameter for a small angle A. It is known that a beam will spread within an optical guide by a diffraction angle that is inversely proportional to the beam diameter. Thus, it is necessary to provide a wide enough beam so that its diffraction spread is smaller than d at the last sample. It can be calculated that the total length of the beam's optical path L within the plate is 0.5 meters ($100 \times 25$ psec $\times 2.10^8$ m/sec). Accordingly, the beam diameter d should be $(WL)^{\frac{1}{2}}$, where W is the beam wavelength, or about 0.6 mm for red or near infrared lasers. Since the spacing h between adjacent beam spots should be larger than d to avoid overlap of successive samples, the length of the plate should be approximately 6 cm (0.6 mm $\times$ 100).

Figure 2:
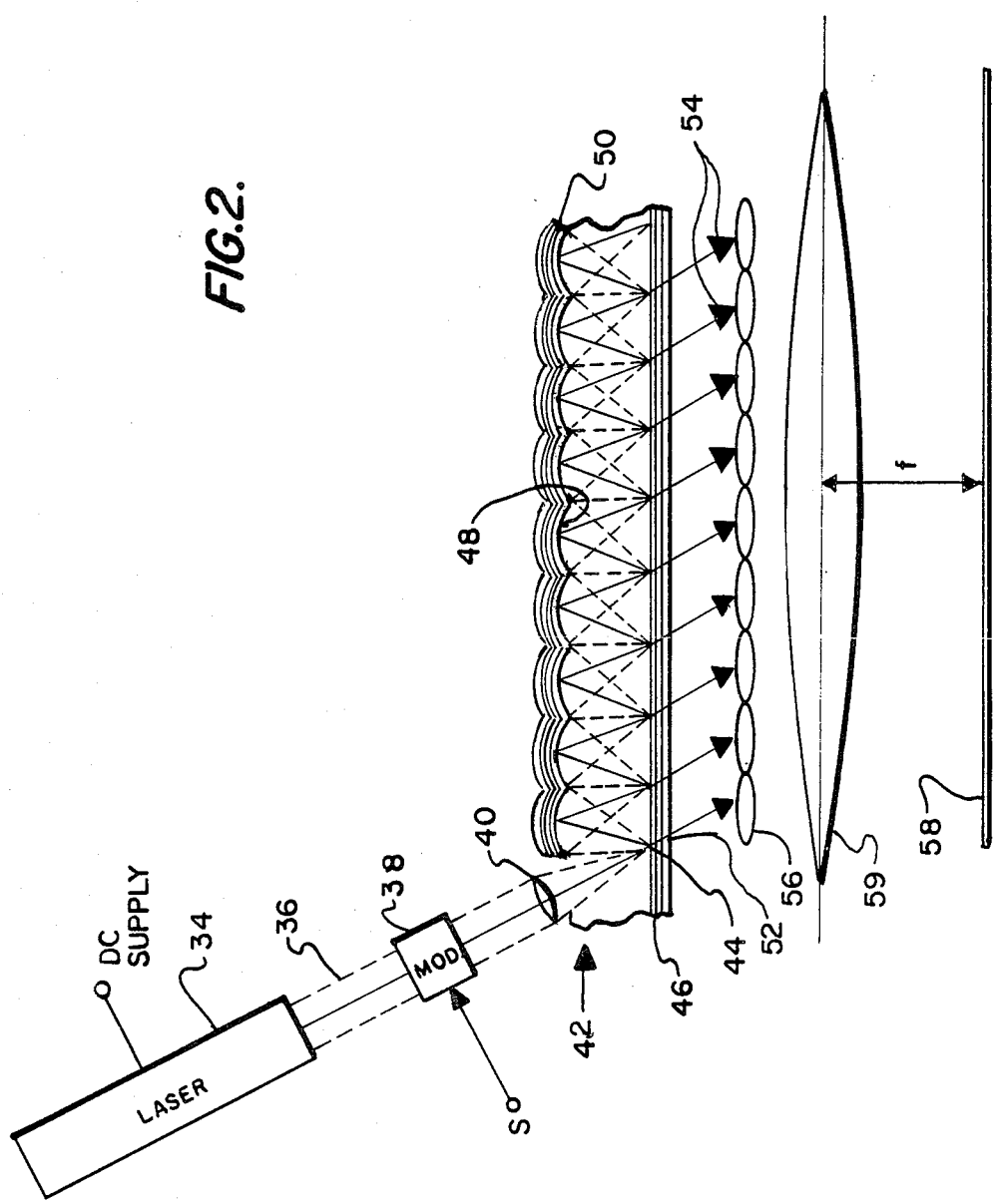
FIG. 2 is a simplified, partially sectioned view of a second embodiment of the invention in which one of the plate surfaces is formed with a series of curved reflective surfaces.

A system for effectively reducing the distance h between sample points by reducing the beam spot size d at the partially reflective plate 8, without a corresponding increase in the diffraction spread, is shown in FIG. 2. In this embodiment a laser 34 generates a beam 36 which is modulated in response to high frequency signal S by a separate, fast response electro-optic modulator 38. This type of arrangement could also have been used in the embodiment of FIG. 1; conversely, the modulation scheme of FIG. 1 could be used in the FIG. 2 embodiment. The beam is focused by a lens 40 located just above optical guide plate 42 to a small spot 44 on the lower, partially reflective surface 46 of the plate. The upper plate surface to the right of lens 40 is formed as a series of adjacent curved reflective surfaces 48 which are concave with respect to the lower plate surface. Each of the curved surfaces 48 is in the form of a cylindrical section or ridges which extends into the plate. A dielectric mirror 50 which conforms to the curved plate surface provides the required reflectivity. The dimensions and spacings of the reflective surfaces are coordinated with the plate thickness and the beam angle entering the plate so that the beam follows a zigzag path through the plate which is reflected off of each successive curved surface.

The partially reflective surface 46 lies along the locus of the centers of curvature for each of the upper curved surfaces 48. Thus, the portion of the beam which is reflected from spot 44 on the partially reflective surface expands and diverges as it traverses the plate to the first upper curved surface. There it is reflected back down through the plate and focused to a small spot 52 (ideally a point), from which it is again partially reflected in a diverging path back up through the plate toward the next upper curved reflective surface. The beam continues to reflect back and forth through the plate in this fashion, progressing from each curved surface to the next. At each intersection with the lower surface 46 a portion of the beam is transmitted out of the plate as a sample ray 54. The rays 54 diverge in a manner similar to the portion of the beam which is reflected back on surface 46, but they are focused by another array of lenticular lenses 56, which have dimensions matching the curved surface 48. Lens array 56 is disposed parallel to the plate, and collimates rays 54 onto a lens 59 which produces a Fourier mapping surface 58 which is located at a focal length from the lens.

With the focal length of each reflective surface 48 kept to half the plate thickness, the laser beam will be focused down to a small spot each time it reaches the lower partially reflective surface 46. Since the spot size at this surface is considerably smaller than with the collimated beam of FIG. 1, there is less of an overlap problem and the device can be structured so that the output rays 54 are closer together. The density of curved reflectors 48 should preferably be at least 40 per cm. Such densities are commercially available in plastic material, although it would be preferable to have high quality optical glass for the plate substrate.

An end view of another possible embodiment for the beam guide is illustrated in FIG. 3. In this embodiment the guide 60 has a rectangular shape, with three walls 62, 64, 66 provided with totally reflective surfaces and the fourth wall 68 with a partially reflective surface. The optical beam 70 reflects successively off each of the walls as it propagates down the guide (into the page), with an output ray 72 emitted at each location where the beam strikes the partially reflective surface 68. This approach is not as desirable as those of FIGS. 1 or 2, but is mentioned to illustrate the possibility of various other types of beam guides being used.

FIG. 4 illustrates another embodiment of the present invention's approach of using simultaneous samples of a beam to represent spaced locations along the beam, in contrast to the prior art approach of observing one location in a beam over time to determine its frequency spectrum. A laser 74 is powered by a DC supply and modulated by a high frequency electrical signal S as in the previous embodiments. The laser beam 76 is directed onto the ends of a bundle of optical fibers 78. The opposite ends of the different fibers within the bundle 78 are held together, but the individual fibers each have different lengths. The various fiber lengths are selected so that the rays emitted from their output ends represent samples of the input beam at spaced locations along the beam, the locations corresponding to the sample spacings in the embodiment of FIGS. 1 and 2. In other words, the distance in length between each successive pair of fibers is equal to the length of the beam path between successive sample points in FIGS. 1 and 2. The outputs of the fibers are directed through a lens 80 onto a Fourier mapping surface 82 to obtain a frequency spectrum mapping. Because of problems in attaining the required precision in the length of the fibers and the spacing between fibers, and the effects of temperature changes, this embodiment is not as desirable as that of FIGS. 1 or 2.

Various embodiments of a novel high frequency spectrum analyzer have thus been shown and described. As numerous various and alternate embodiments will occur to those skilled in the art, it is intended that the invention be limited only in terms of the appended claims.

We claim:

1. A method of high frequency spectrum analysis, comprising:
    modulating an optical beam with a high frequency signal to be analyzed,
    sampling the beam to obtain periodically spatially-spaced and substantially parallel sample portions of the modulated beam substantially simultaneously, and
    spectrum analyzing said sample portions.

2. The method of claim 1, wherein said sampling is accomplished by diverting sample portions of the beam at periodically spaced locations along the beam path.

3. The method of claim 1, wherein the optical beam is formed with a laser, and the beam is modulated by modulating the laser.

4. The method of claim 1, wherein the optical beam is formed with a laser, and the beam is modulated with an electro-optic modulator after exiting the laser.

5. The method of claim 1, wherein said sampling is accomplished by dividing the beam along a plurality of different length paths, the lengths of said paths corresponding to the periodically spaced sampling locations.

6. A method of high frequency spectrum analysis, comprising:
modulating an optical beam with a high frequency signal to be analyzed,
directing the modulated beam along a predetermined path,
diverting substantially parallel sample portions of the beam from said path at periodically spaced locations along the path substantially simultaneously, and
spectrum analyzing said sample portions.

7. The method of claim 6, wherein said optical beam comprises a laser beam.

8. The method of claim 6, wherein said sample portions are spectrum analyzed by focusing them to a Fourier mapping.

9. A method of high frequency spectrum analysis, comprising:
modulating an optical beam with a high frequency signal to be analyzed,
transmitting the beam in a zigzag path through an optical guide between first and second opposed surfaces, the first surface being partially internally reflective and the second surface being at least partially internally reflective, the beam partially reflecting from and partially transmitting through said first surface at periodic locations along the guide, and
performing a spectrum analysis solely upon the portions of the beam transmitted through said first surface.

10. The method of claim 9, wherein said beam is transmitted through the guide substantially collimated.

11. The method of claim 9, wherein said beam is focused by said second guide surface toward said first surface and thereafter diverges upon partial reflection from said first surface back towards the second surface, whereby the cross-section of the beam at the first surface is smaller than its cross-section outside the guide.

12. The method of claim 11, wherein the beam is focused toward the first surface prior to entering the guide.

13. The method of claim 9, wherein the beam is substantially totally reflected from the second guide surface.

14. A high frequency spectrum analyzer, comprising:
means for modulating an optical beam with a high frequency signal to be analyzed,
means for substantially simultaneously sampling periodically spatially-spaced and substantially parallel portions of the modulated beam, and
means for spectrum analyzing said sample portions.

15. The high frequency spectrum analyzer of claim 14, said sampling means comprising means for diverting sample portions of the beam at periodically spaced locations along the beam path.

16. The high frequency spectrum analyzer of claim 14, said modulating means comprising a laser which is responsive to the high frequency signal to produce a modulated laser beam.

17. The high frequency spectrum analyzer of claim 14, said modulating means comprising means responsive to the high frequency signal for modulating a laser beam.

18. The high frequency spectrum analyzer of claim 14, said sampling means comprising a plurality of optical fibers of different lengths, one end of each fiber being positioned together with one end of each of the other fibers to receive respective portions of the beam, and the opposite ends of said fibers being positioned to provide said sample portions.

19. A high frequency spectrum analyzer, comprising:
means for modulating an optical beam with a high frequency signal to be analyzed,
means for directing the modulated beam along a predetermined path,
means for substantially simultaneously diverting sample portions of the beam from said path substantially parallel to each other and at periodically spaced locations along the path, and
means for focusing the diverted sample portions for spectrum analysis.

20. A high frequency spectrum analyzer, comprising:
an optically transmissive plate bounded on one side by a first surface which is partially internally reflective, and on another side by a second surface which is opposed to the first surface and is at least partially internally reflective, the plate forming a transmission guide for an optical beam between said two surfaces,
means for modulating an optical beam with a high frequency signal to be analyzed,
means for directing the modulated beam into the plate at an angle between parallel and normal to the first and second plate surfaces so that the beam propagates along the channel by alternating reflections between said two surfaces, partial samples of the beam being transmitted through the first surface at each location of incidence therewith, and
means for focusing the beam samples transmitted solely through the first surface for spectrum analysis.

21. The high frequency spectrum analyzer of claim 20, said directing means directing the beam through the plate substantially collimated and at an angle such that the successive areas of incidence of the beam upon the first surface do not overlap.

22. The high frequency spectrum analyzer of claim 20, wherein said second plate surface comprises a series of internally concave reflective surfaces having curvatures to image points on the first surface substantially back onto the first surface.

23. The high frequency spectrum analyzer of claim 22, wherein the focal lengths of said concave reflective surfaces are substantially equal to half the width of the plate between the first and second surfaces.

24. The high frequency spectrum analyzer of claim 23, said beam directing means including a lens positioned in the beam path prior to said plate for focusing said beam into the plate and onto said first surface at an angle and with a degree of convergency to establish a zigzag beam propagation through the plate with alternating reflections off the first surface and successive reflective surfaces of the second surface, the beam expanding in transit from the first to the second surface and converging in transit from the second to the first surface, the cross-section of the beam at the first surface being less than its cross-section prior to focusing by the lens.

25. The high frequency spectrum analyzer of claim 23, wherein said first plate surface is substantially at the center of curvature of the internally concave reflective surfaces.

26. The high frequency spectrum analyzer of claim 20, said plate surfaces comprising respective dielectric mirrors with multiple dielectric layers, the dielectric mirror for the first surface having a lesser number of layers than the dielectric mirror for the second surface.

27. The high frequency spectrum analyzer of claim 26, the thicknesses of the dielectric mirror layers for the first surface being progressively varied along the length of the plate to compensate for the loss of beam power along the plate and to keep the intensities of the beam samples substantially equal.

28. The high frequency spectrum analyzer of claim 20, said focusing means comprising a lens substantially parallel to the first plate surface for focusing the transmitted beam samples to a Fourier mapping.

29. The high frequency spectrum analyzer of claim 20, wherein said second surface is substantially totally internally reflective.

30. The high frequency spectrum analyzer of claim 20, wherein the plate dimensions and the beam angle relative to the plate are selected so that the distance along the beam path between successive samples is no greater than half the wavelength of the highest signal frequency to be analyzed.

* * * * *